(12) United States Patent
Origasa

(10) Patent No.: US 7,535,781 B2
(45) Date of Patent: May 19, 2009

(54) SEMICONDUCTOR MEMORY

(75) Inventor: Kenichi Origasa, Osaka (JP)

(73) Assignee: Panasonic Corporation, Osaka (JP)

( * ) Notice: Subject to any disclaimer, the term of this patent is extended or adjusted under 35 U.S.C. 154(b) by 166 days.

(21) Appl. No.: 11/727,910

(22) Filed: Mar. 29, 2007

(65) Prior Publication Data

US 2007/0230262 A1 Oct. 4, 2007

(30) Foreign Application Priority Data

Mar. 29, 2006 (JP) .............................. 2006-090423

(51) Int. Cl.
G11C 11/00 (2006.01)
(52) U.S. Cl. ...................................... 365/203; 365/226
(58) Field of Classification Search ................. 365/203, 365/226
See application file for complete search history.

(56) References Cited

U.S. PATENT DOCUMENTS

| | | | |
|---|---|---|---|
| 4,780,850 A * | 10/1988 | Miyamoto et al. ..... | 365/189.09 |
| 4,858,194 A * | 8/1989 | Terada et al. ........... | 365/185.25 |
| 5,999,469 A * | 12/1999 | Brown ........................ | 365/203 |
| 6,005,793 A * | 12/1999 | Tran ........................... | 365/154 |
| 6,081,468 A * | 6/2000 | Taira et al. .................. | 365/203 |
| 2003/0058720 A1 | 3/2003 | Park | |
| 2003/0081447 A1 | 5/2003 | Hsu et al. | |
| 2006/0181953 A1 | 8/2006 | Rotenberg et al. | |

FOREIGN PATENT DOCUMENTS

JP 2003-151276 5/2003

OTHER PUBLICATIONS

S. Itoh, "Very LSI Memory", Advanced Electronic Series I-9, p. 85-96, Baifukan Co., Ltd., Jan. 2003.

* cited by examiner

*Primary Examiner*—Michael T Tran
(74) *Attorney, Agent, or Firm*—McDermott Will & Emery LLP

(57) ABSTRACT

A semiconductor memory including a memory cell, a bit line pair connected to the memory cell, a data line pair connected to the bit line pair through a switching element capable of ON/OFF switching in response to a value of a column selection signal and a precharge circuit for controlling an initial potential common between the data line pair. The semiconductor memory comprises a precharge potential control circuit which applies, in a precharge period, a low apply voltage not higher than a first predetermined potential to the data line pair when the initial potential of the data line pair is higher than the first predetermined potential, a high apply voltage not lower than a second predetermined potential to the data line pair when the potential of the data line pair is lower than the second predetermined potential or no voltage when the potential of the data line pair is not higher than the first predetermined potential and not lower than the second predetermined potential.

17 Claims, 8 Drawing Sheets

SEMICONDUCTOR MEMORY

CROSS-REFERENCE TO RELATED APPLICATION

This non-provisional application claims priority under 35 U.S.C. §119(a) of Japanese Patent Application No. 2006-90423 filed in Japan on Mar. 29, 2006, the entire contents of which are hereby incorporated by reference.

BACKGROUND OF THE INVENTION

1. Field of the Invention

The present invention relates to a semiconductor memory such as a dynamic random access memory (DRAM).

2. Description of Related Art

Japanese Unexamined Patent Publication No. 2003-151276 discloses an example of conventional semiconductor memories (paragraphs [0020]-[0036], FIG. 4A). The disclosed semiconductor memory is provided with a circuit including global data lines 40A and 40B connected to a local data line connected to a memory core through a switching unit 620 made of a transfer gate. During a precharge period, the global data lines 40A and 40B are connected to a precharge power supply whose potential is half of external power supply voltage $V_{DD}(V_{DD}/2)$.

In the conventional structure described above, the following problem arises when the H level potential of the local data line during reading is set equal to the H level potential of the global data lines 40A and 40B during writing.

Here, the H level potential of the local data line during reading and the H level potential of the global data lines 40A and 40B during writing are represented as voltage VDD and their L level potentials as voltage GND (0V).

In a reading operation, the potential of the global data lines 40A and 40B on the L side is the voltage GND, while that on the H side is increased only to $VDD-V_t$, which is a potential lower than the voltage VDD by threshold voltage $V_t$ of the transistor forming the switching unit 620. Therefore, an average potential of the global data lines 40A and 40B is $0.5\times(VDD-V_t)$.

In a writing operation, the potential of the global data lines 40A and 40B on the H side is the voltage VDD and that on the L side is the voltage GND. Therefore, an average potential of the global data lines 40A and 40B is $0.5\times VDD$.

In such a case, the average potential of the global data lines 40A and 40B in the reading operation varies from that in the writing operation. Therefore, in the conventional structure which is configured to apply constant voltage from a certain voltage generator at all times during the precharge period, electric current flows at least in the precharge period after the reading or writing, thereby consuming power. To be more specific, when the potential of the precharge power supply is $0.5\times(VDD-V_t)$, which is the same as the average potential of the global data lines 40A and 40B during reading, a potential difference occurs and the current flow because the average potential of the global data lines 40A and 40B at the beginning of the precharge period after the writing is $0.5\times VDD$. On the other hand, when the potential of the precharge power supply is $0.5\times VDD$, which is the same as the average potential of the global data lines 40A and 40B during writing, a potential difference occurs and the current flows because the average potential of the global data lines 40A and 40B at the beginning of the precharge period after the reading is $0.5\times(VDD-V_t)$. In general, a semiconductor memory includes about 1,000 precharge circuits. Therefore, if the current flows as described above during the precharge period, power consumption by the semiconductor memory is increased.

SUMMARY OF THE INVENTION

The present invention has been achieved in view of the above-described problem. An object of the invention is to reduce the current consumption by the semiconductor memory during precharge.

In order to achieve the object, a semiconductor memory according to a first aspect of the present invention includes a memory cell, a bit line pair connected to the memory cell, a data line pair connected to the bit line pair through a switching element capable of ON/OFF switching in response to a value of a column selection signal and a precharge circuit for controlling an initial potential common between the data line pair, wherein the semiconductor memory includes a precharge potential control circuit which applies, in a precharge period, a low apply voltage not higher than a first predetermined potential to the data line pair when the initial potential of the data line pair is higher than the first predetermined potential, a high apply voltage not lower than a second predetermined potential to the data line pair when the potential of the data line pair is lower than the second predetermined potential or no voltage when the potential of the data line pair is not higher than the first predetermined potential and not lower than the second predetermined potential.

The semiconductor memory according to the first aspect maintains the potential of the data line pair not higher than the first predetermined potential and not lower than the second predetermined potential during precharge. When the potential of the data line pair is not higher than the first predetermined potential and not lower than the second predetermined potential, the precharge potential control circuit does not apply any voltage to the data line pair. Therefore, the current does not flow between the precharge potential control circuit and the data line pair.

According to a second aspect of the present invention, the precharge potential control circuit of the semiconductor memory of the first aspect includes a predetermined potential output circuit which divides a voltage between a low apply voltage generator for generating the low apply voltage and a high apply voltage generator for generating the high apply voltage to output the first and second predetermined potentials.

As to the semiconductor memory according to the second aspect, the precharge potential control circuit is achieved easily with a relatively small circuit area.

According to a third aspect of the present invention, the precharge potential control circuit of the semiconductor memory of the second aspect includes an n-channel MOS transistor connected to the high apply voltage generator via a drain and a gate thereof and the predetermined potential output circuit divides a voltage between a source of the n-channel MOS transistor connected to the high apply voltage generator and the low apply voltage generator to output the first and second predetermined potentials.

As to the semiconductor memory according to the third aspect, the dependence of the potential of the source of the n-channel MOS transistor connected to the high apply voltage generator on the high apply voltage comes close to the dependence of the average potential of the data line pair during reading on the high apply voltage. Therefore, the precharge potential control circuit is operated within a broader range of the high apply voltage as compared with the case when the second predetermined potential is obtained by dividing the voltage only with resistance elements.

According to a fourth aspect of the present invention, the switching element of the semiconductor memory of the third aspect is an n-channel MOS transistor of the same size as the n-channel MOS transistor connected to the high apply voltage generator.

As to the semiconductor memory according to the fourth aspect, the precharge potential control circuit is easily achieved with operation stability and less influence by variations in the manufacturing process.

According to a fifth aspect of the present invention, the predetermined potential output circuit of the semiconductor memory of the second aspect includes a p-channel MOS transistor which is connected to the high apply voltage generator via a source thereof and has a drain and a gate connected to each other and the predetermined potential output circuit divides a voltage between the drain and the gate of the p-channel MOS transistor connected to the high apply voltage generator and the low apply voltage generator to output the first and second predetermined potentials.

As to the semiconductor memory according to the fifth aspect, the dependence of the potential of the drain and the gate of the p-channel MOS transistor connected to the high apply voltage generator on the high apply voltage comes close to the dependence of the average potential of the data line pair during reading on the high apply voltage. Therefore, the precharge potential control circuit is operated within a broader range of the high apply voltage as compared with the case when the second predetermined potential is obtained by dividing the voltage only with resistance elements.

According to a sixth aspect of the present invention, the predetermined potential control circuit of the semiconductor memory of the second aspect divides the voltage between the low apply voltage generator and the high apply voltage generator with resistance elements capable of adjusting their resistance values.

As to the semiconductor memory according to the sixth aspect, even if there are variations in a circuit pattern formed on a wafer, the precharge potential control circuit is operated at the first and second predetermined potentials as required by adjusting the resistance values.

According to a seventh aspect of the present invention, the precharge potential control circuit of the semiconductor memory of the first aspect includes an n-channel MOS transistor connected to the low apply voltage generator via a source thereof and connected to the data line pair via a drain thereof, a p-channel MOS transistor connected to the high apply voltage generator via a source thereof and connected to the data line pair via a drain thereof, an n-channel MOS transistor control circuit which outputs a voltage to a gate of the n-channel MOS transistor to activate or deactivate the n-channel MOS transistor when the potential of the data line pair is higher or lower than the first predetermined potential, and a p-channel MOS transistor control circuit which outputs a voltage to a gate of the p-channel MOS transistor to activate or deactivate the p-channel MOS transistor when the potential of the data line pair is lower or higher than the second predetermined potential.

According to an eighth aspect of the present invention, the precharge potential control circuit of the semiconductor memory of the first aspect includes a first differential amplifier circuit which receives the potential of the data line pair and the first predetermined potential and outputs a voltage corresponding to the magnitude relation between the potential of the data line pair and the first predetermined potential and a second differential amplifier circuit which receives the potential of the data line pair and the second predetermined potential and outputs a voltage corresponding to the magnitude relation between the potential of the data line pair and the second predetermined potential and the precharge potential control circuit determines whether or not the low apply voltage is applied to the data line pair in accordance with the output of the first differential amplifier circuit and determines whether or not the high apply voltage is applied to the data line pair in accordance with the output of the second differential amplifier circuit.

As to the semiconductor memory according to the seventh and eighth aspects, the precharge potential control circuit is achieved easily with a relatively small circuit area.

According to a ninth aspect of the present invention, the semiconductor memory of the first aspect further includes a sense amplifier circuit for amplifying a signal of the bit line pair, wherein a high drive voltage for the sense amplifier circuit is supplied from a voltage generator for generating the high apply voltage.

According to a tenth aspect of the present invention, the semiconductor memory of the first aspect further includes a sense amplifier for amplifying a signal of the bit line pair, wherein a low drive voltage for the sense amplifier circuit is supplied from a voltage generator for generating the low apply voltage.

As to the semiconductor memory according to the ninth and tenth aspects, the drive voltage for the sense amplifier circuit becomes identical to the apply voltage of the precharge circuit and the potential generated in the bit line pair by the amplification by the sense amplifier circuit is dependent on the apply voltage. Therefore, the power consumption is reduced while the suitable range of the apply voltage is kept broad.

According to an eleventh aspect of the present invention, the semiconductor memory of the first aspect includes a sense amplifier circuit for amplifying a signal of the bit line pair, wherein the switching element is an n-channel MOS transistor which is activated by the same voltage as the higher drive voltage for the sense amplifier circuit.

As to the semiconductor memory according to the eleventh aspect, the sense amplifier circuit and the switching element are achieved easily with a relatively small circuit area because a power supply is shared between the sense amplifier and the switching element and there is no need of providing power supplies for the sense amplifier circuit and the switching circuit, respectively.

According to a twelfth aspect of the present invention, the semiconductor memory of the first aspect includes a read amplifier circuit for amplifying a signal of the data line pair, wherein the read amplifier circuit includes a first n-channel MOS transistor connected to a low drive voltage generator for generating a low drive voltage for the read amplifier circuit via a source thereof, connected to a first data line of the data line pair via a drain thereof and connected to a second data line of the data line pair via a gate thereof during the amplification, a second n-channel MOS transistor connected to the low drive voltage generator via a source thereof, connected to the second data line via a drain thereof and connected to the first data line via a gate thereof during the amplification, a first p-channel MOS transistor connected to a high drive voltage generator for generating a high drive voltage for the read amplifier circuit via a source thereof, connected to the first data line via a drain thereof and connected to the second data line via a gate thereof during the amplification and a second p-channel MOS transistor connected to the high drive voltage generator via a source thereof, connected to the second data line via a drain thereof and connected to the first data line via a gate thereof during the amplification.

As to the semiconductor memory according to the twelfth aspect, the read amplifier circuit is achieved with fewer transistors. Further, as the data line pair is precharged to a potential not higher than the first predetermined potential and not lower than the second predetermined potential by the precharge circuit and the precharge potential control circuit, the read amplifier circuit is improved in sensitivity.

According to a thirteenth aspect of the present invention, the precharge circuit of the semiconductor memory of the first aspect enables current to flow from the precharge circuit to the data line pair when the potential of the data line pair is higher than a third predetermined potential which is higher than the first predetermined potential, the current being larger than current flowing when the potential of the data line pair is not higher than the third predetermined potential.

According to a fourteenth aspect of the present invention, the precharge circuit of the semiconductor memory of the first aspect enables current to flow from the precharge circuit to the data line pair when the potential of the data line pair is lower than a fourth predetermined potential which is lower than the second predetermined potential, the current being larger than current flowing when the potential of the data line pair is not lower than the fourth predetermined potential.

According to a fifteenth aspect of the present invention, the precharge circuit of the semiconductor memory of the first aspect enables current to flow from the precharge circuit to the data line pair when the potential of the data line pair is higher than a third predetermined potential which is higher than the first predetermined potential, the current being larger than current flowing when the potential of the data line pair is not higher than the third predetermined potential and the precharge circuit enables current to flow from the precharge circuit to the data line pair when the potential of the data line pair is lower than a fourth predetermined potential which is lower than the second predetermined potential, the current being larger than current flowing when the potential of the data line pair is not lower than the fourth predetermined potential.

As to the semiconductor memory of the fifteenth aspect, a current which is smaller than a current flowing when the potential of the data line pair is higher than the third predetermined potential flows when the potential of the data line pair is higher than the first predetermined potential and not higher than the third predetermined potential. Therefore, the potential of the data line pair is gradually decreased. Likewise, when the potential of the data line pair is lower than the second predetermined potential and not lower than the fourth predetermined potential, a current smaller than a current flowing when the potential of the data line pair is lower than the fourth predetermined potential flows. As a result, the potential of the data line pair is gradually increased.

According to a sixteenth aspect of the present invention, the precharge potential control circuit of the semiconductor memory of the fifteenth aspect includes a predetermined potential output circuit which divides a voltage between a low apply voltage generator for generating the low apply voltage and a high apply voltage generator for generating the high apply voltage to output the first, second, third and fourth predetermined potentials.

As to the semiconductor memory according to the sixteenth aspect, the four predetermined potentials are output by the single predetermined potential output circuit. Therefore, the precharge potential control circuit is achieved easily with a relatively small circuit area.

According to a seventeenth aspect of the present invention, the precharge potential control circuit of the semiconductor memory of the fifteenth aspect includes a first n-channel MOS transistor and a second n-channel MOS transistor each of which is connected to the low apply voltage generator via a source thereof and connected to the data line pair via a drain thereof, a first p-channel MOS transistor and a second p-channel MOS transistor each of which is connected to the high apply voltage generator via a source thereof and connected to the data line pair via a drain thereof, a first n-channel MOS transistor control circuit which outputs a voltage to a gate of the first n-channel MOS transistor to activate or deactivate the first n-channel MOS transistor when the potential of the data line pair is higher or lower than the third predetermined potential, a second n-channel MOS transistor control circuit which outputs a voltage to a gate of the second n-channel MOS transistor to activate or deactivate the second n-channel MOS transistor when the potential of the data line pair is higher or lower than the first predetermined potential, a first p-channel MOS transistor control circuit which outputs a voltage to a gate of the first p-channel MOS transistor to activate or deactivate the first p-channel MOS transistor when the potential of the data line pair is lower or higher than the second predetermined potential and a second p-channel MOS transistor control circuit which outputs a voltage to a gate of the second p-channel MOS transistor to activate or deactivate the second p-channel MOS transistor when the potential of the data line pair is lower or higher than the fourth predetermined potential.

According to an eighteenth aspect of the present invention, in the semiconductor memory of the seventeenth aspect, the size of the first n-channel MOS transistor is larger than that of the second n-channel MOS transistor and the size of the second p-channel MOS transistor is larger than the first p-channel MOS transistor.

According to a nineteenth aspect of the present invention, the precharge potential control circuit of the semiconductor memory of the fifteenth aspect includes a first differential amplifier circuit which receives the potential of the data line pair and the third predetermined potential and outputs a voltage corresponding to the magnitude relation between the potential of the data line pair and the third predetermined potential, a second differential amplifier circuit which receives the potential of the data line pair and the first predetermined potential and outputs a voltage corresponding to the magnitude relation between the potential of the data line and the first predetermined potential, a third differential amplifier circuit which receives the potential of the data line pair and the second predetermined potential and outputs a voltage corresponding to the magnitude relation between the potential of the data line and the second predetermined potential, a fourth differential amplifier circuit which receives the potential of the data line pair and the fourth predetermined potential and outputs a voltage corresponding to the magnitude relation between the potential of the data line and the fourth predetermined potential, the precharge potential control circuit determines whether or not the low apply voltage is applied to the data line pair in accordance with the output of the second differential amplifier circuit and whether or not the high apply voltage is applied to the data line pair in accordance with the output of the third differential amplifier circuit and the precharge potential control circuit changes current flowing to the precharge circuit in accordance with the outputs of the first and fourth differential amplifier circuits.

As to the semiconductor memory according to the seventeenth to nineteenth aspects, the precharge potential control circuit is achieved easily with a relatively small circuit area.

DETAILED DESCRIPTION OF THE INVENTION

Figure 1:
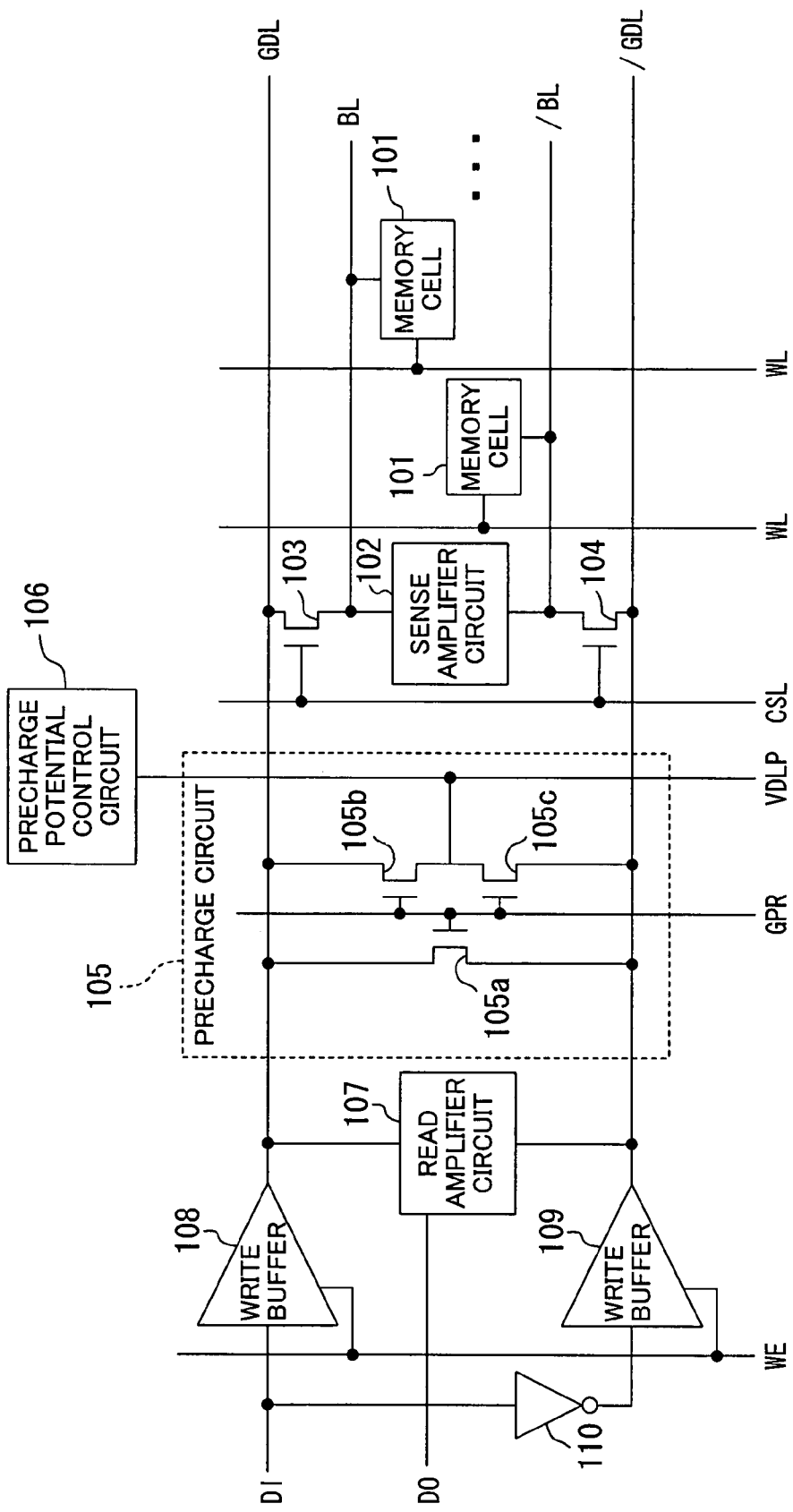
FIG. 1 is a circuit diagram illustrating the structure of a semiconductor memory according to a first embodiment of the present invention.

Hereinafter, embodiments of the present invention are described with reference to the drawings. In the following embodiments, the same components with the same functions are indicated by the same reference numerals for the sake of easy explanation.

First Embodiment

FIG. 1 is a circuit diagram illustrating the structure of a semiconductor memory according to a first embodiment of the present invention.

As shown in FIG. 1, the semiconductor memory includes a memory cell 101, a sense amplifier circuit 102, n-channel MOS transistors (switching elements) 103 and 104, a precharge circuit 105, a precharge potential control circuit 106, a read amplifier circuit 107, write buffers 108 and 109 and an inverter 110.

The memory cell 101 is connected to either one of bit lines BL and BL and a word line WL. When the connected word line WL is activated, the memory cell 101 performs data input/output from/to the connected bit line BL or BL.

The sense amplifier circuit 102 is configured to amplify the potential difference between the bit line pair BL and BL. The sense amplifier circuit 102 outputs voltage VDD as a high drive voltage and voltage GND (0V) as a low drive voltage.

The n-channel MOS transistor 103 is connected between a global data line GDL (data line) and the bit line BL and its gate is configured to receive a column selection signal CSL.

The n-channel MOS transistor 104 is connected between a global data line GDL (data line) and the bit line BL and its gate is configured to receive the column selection signal CSL.

The H level of the column selection signal CSL is the voltage VDD and the L level thereof is the voltage GND.

The n-channel MOS transistors 103 and 104 are activated at the voltage VDD, which is the same as the high drive voltage of the sense amplifier circuit 102.

The precharge circuit 105 includes n-channel MOS transistors 105a to 105c. The gates of the n-channel MOS transistors 105a to 105c are configured to receive a global data line precharge signal GPR. The n-channel MOS transistors 105a to 105c are activated during a precharge period.

When the potential of the global data lines GDL and /GDL is higher than a first predetermined potential VRN, the precharge potential control circuit 106 applies the voltage GND to the global data lines GDL and /GDL. When the potential of the global data lines GDL and /GDL is lower than a second predetermined potential VRP, the precharge potential control circuit 106 applies the voltage VDD to the global data lines GDL and /GDL. Further, when the potential of the global data lines GDL and /GDL is not higher than the first predetermined potential VRN and not lower than the second predetermined potential VRP, the precharge potential control circuit 106 does not apply any voltage to the global data lines GDL and /GDL. The structure of the precharge potential control circuit 106 is described later in detail.

The read amplifier circuit 107 is configured to amplify the potential difference between the global data line pair GDL and /GDL and outputs output data DO. The structure of the read amplifier circuit 107 is described later in detail.

The write buffers 108 and 109 are activated or deactivated by a write enable signal WE. The write buffer 108 receives input data DI and outputs it as it is to the global data line GDL in the active state, while the write buffer 108 does not output the input data DI to the global data line GDL in the inactive state. The write buffer 109 is configured to receive inversion data /DI which is an inverted version of the input data DI output from the inverter 110. The write buffer 109 outputs the inversion data /DI as it is to the global data line /GDL in the active state, while it does not output the inversion data /DI to the global data line /GDL in the inactive state.

Next, the structure of the precharge potential control circuit 106 is described in detail.

Figure 2:
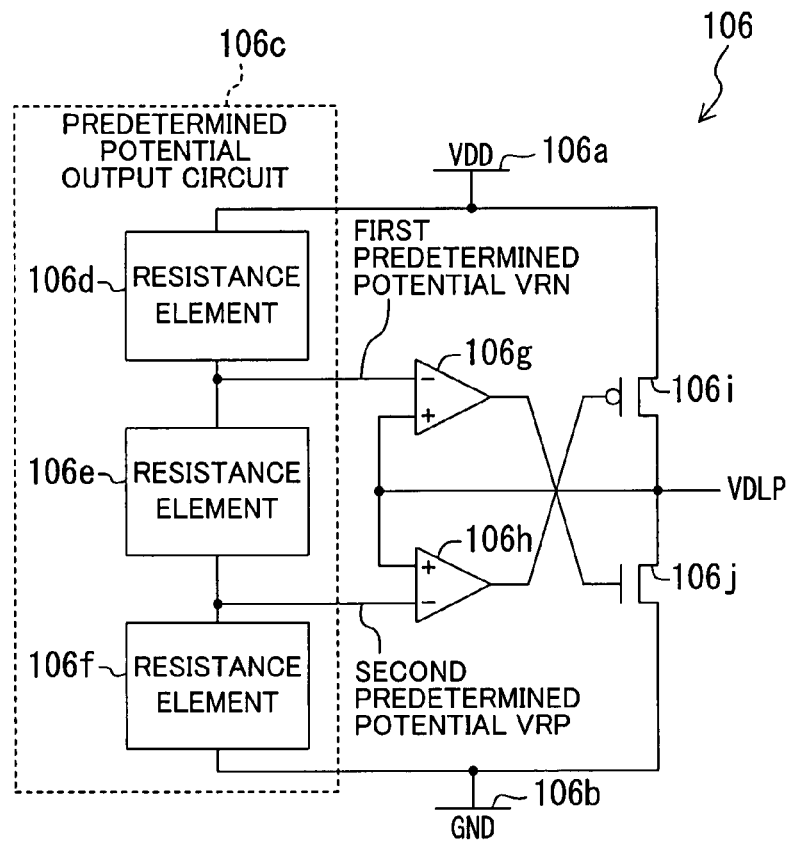
FIG. 2 is a circuit diagram illustrating the structure of a precharge potential control circuit 106 according to the first embodiment.

As shown in FIG. 2, the precharge potential control circuit 106 includes a high apply voltage generator 106a, a low apply voltage generator 106b, a predetermined potential output circuit 106c, differential amplifier circuits 106g and 106h, a p-channel MOS transistor 106i and an n-channel MOS transistor 106j.

The high apply voltage generator 106a generates the voltage VDD and supplies it to the sense amplifier circuit 102 as a high drive voltage.

The low apply voltage generator 106b generates the voltage GND and supplies it to the sense amplifier circuit 102 as a low drive voltage.

Figure 3:
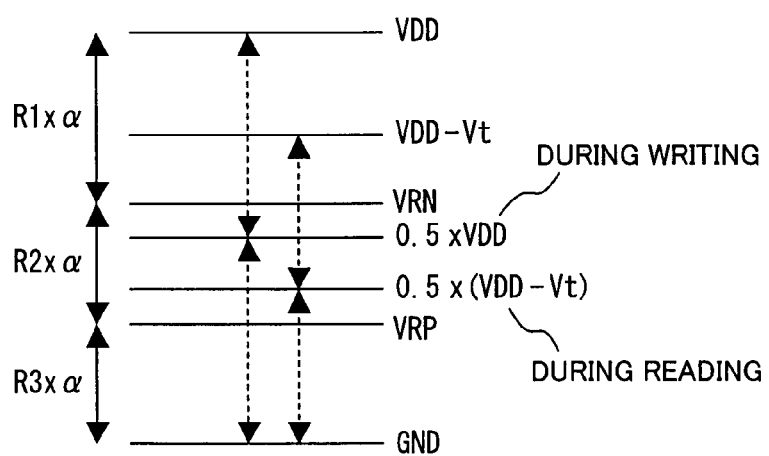
FIG. 3 is a diagram illustrating how first and second predetermined potentials VRN and VRP are determined in the semiconductor memory according to the first embodiment.

The predetermined potential output circuit 106c includes resistance elements 106d to 106f. The predetermined potential output circuit 106c divides a voltage between the high apply voltage generator 106a and the low apply voltage generator 106b to output the first and second predetermined potentials VRN and VRP. For example, as shown in FIG. 3, a voltage higher than 0.5×VDD by a certain amount is output as VRN and a voltage lower than 0.5×(VDD−$V_t$) by a certain amount is output as VRP. An average potential of the global data lines GDL and /GDL during writing is 0.5×VDD and an average potential of the global data lines GDL and /GDL during reading is 0.5×(VDD−$V_t$). Here, the details of the reading and writing are described later. Suppose that the resistance elements 106d to 106f have resistance values R1, R2 and R3, respectively, the following equations are established between the predetermined potentials and the resistance values: the first predetermined potential VRN=VDD×(R2+R3)/(R1+R2+R3); and the second predetermined potential VRP=VDD×R3/(R1+R2+R3). According to the relationship, the resistance values R1, R2 and R3 of the resistance elements 106d to 106f are determined such that the first predetermined potential VRN becomes larger than 0.5×VDD and the second predetermined potential VRP becomes smaller than 0.5×(VDD−$V_t$).

When the potential of the global data lines GDL and /GDL is higher than the first predetermined potential VRN, the differential amplifier circuit 106g outputs a high voltage to the gate of the n-channel MOS transistor 106j to activate the n-channel MOS transistor 106j. On the other hand, when the potential of the global data lines GDL and GDL is not higher than the first predetermined potential VRN, the differential amplifier circuit 106g outputs a low voltage to the gate of the n-channel MOS transistor 106j to deactivate the n-channel MOS transistor 106j.

Further, when the potential of the global data lines GDL and /GDL is lower than the second predetermined potential VRP, the differential amplifier circuit 106h outputs low voltage to the gate of the p-channel MOS transistor 106i to activate the p-channel MOS transistor 106i. On the other hand, when the potential of the global data lines GDL and /GDL is not lower than the second predetermined potential VRP, the differential amplifier circuit 106h outputs high voltage to the gate of the p-channel MOS transistor 106i to deactivate the p-channel MOS transistor 106i.

With this configuration, the potential of the global data lines GDL and /GDL is maintained within the range not higher than the first predetermined potential VRN and not lower than the second predetermined potential VRP.

Then, the structure of the read amplifier circuit 107 (main amplifier circuit) is described in detail.

Figure 4:
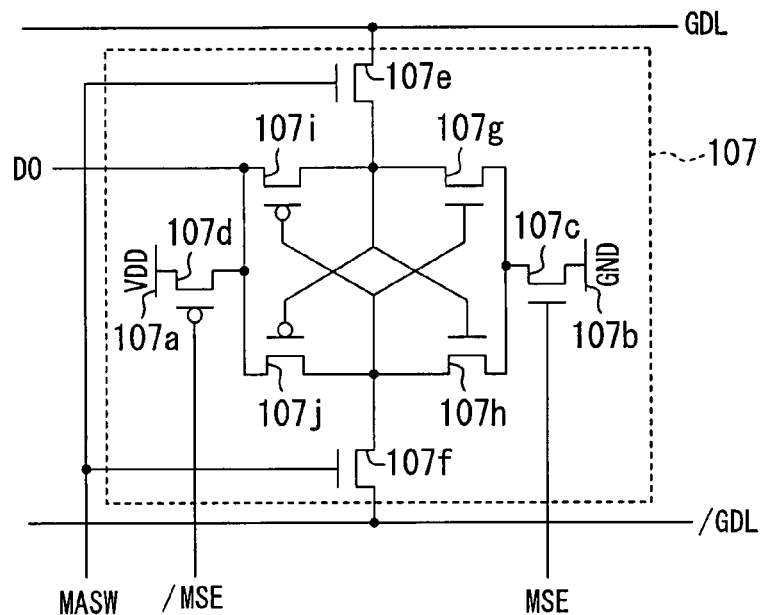
FIG. 4 is a circuit diagram illustrating the structure of a read amplifier circuit 107 according to the first embodiment.

As shown in FIG. 4, the read amplifier circuit 107 is a cross coupled amplifier including drive voltage generators 107a and 107b for generating a drive voltage for the read amplifier circuit 107, n-channel MOS transistors 107c and 107e to 107h, p-channel MOS transistors 107d, 107i and 107j.

The drive voltage generators 107a and 107b are configured to generate the voltages VDD and GND, respectively.

The n-channel MOS transistor 107c and the p-channel MOS transistor 107d are brought into conduction by main amplifier seizing signals MSE and /MSE, respectively, to activate the read amplifier circuit 107.

The n-channel MOS transistors 107e and 107f are brought into conduction by an input signal MASW to a main amplifier switch when the voltage between the global data line pair GDL and /GDL is amplified.

Then, the reading operation of the thus-configured semiconductor memory is described with reference to a timing chart shown in FIG. 5.

Figure 5:
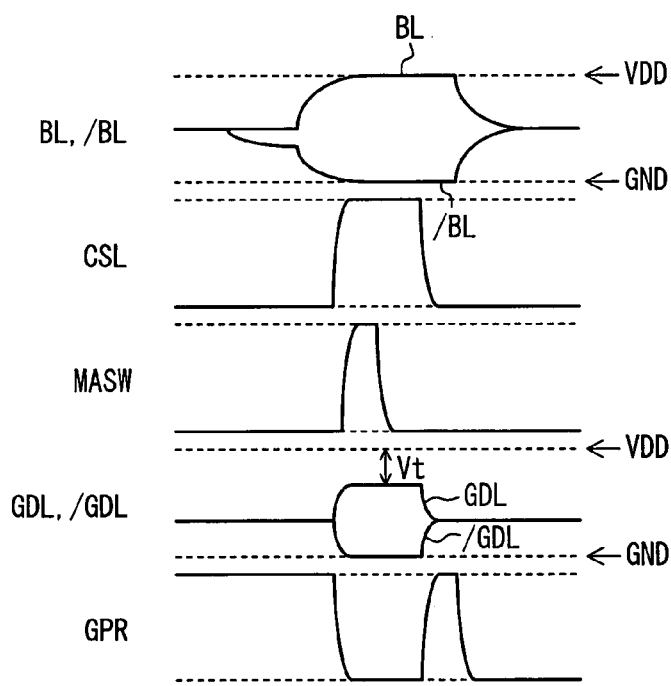
FIG. 5 is a timing chart illustrating voltage levels of signals during the reading operation of the semiconductor memory according to the first embodiment.

The timing chart of FIG. 5 shows voltage levels of signals during the reading operation of the semiconductor memory according to the first embodiment of the present invention.

When the word line WL connected to a certain memory cell 101 becomes active, data stored in the memory cell 101 is output to the bit line BL or /BL. Then, the voltage between the bit lines BL and /BL is amplified by the sense amplifier circuit 102 in the active state. As a result, the potentials of the bit lines BL and /BL after the amplification become the voltages VDD and GND, respectively, as shown in FIG. 5.

When the sense amplifier circuit 102 initiates the amplification of the voltage between the bit lines BL and /BL, the global data line precharge signal GPR is at the H level. Therefore, the global data lines GDL and /GDL are precharged by the precharge circuit 105. That is to say, the n-channel MOS transistors 105a to 105c of the precharge circuit 105 are activated and the potentials of the global data lines GDL and /GDL are controlled by the precharge potential control circuit 106 to be equal to each other within the predetermined range.

The sense amplifier circuit 102 amplifies the potentials of the bit lines BL and /BL to the voltages VDD and GND, respectively, and the column selection signal CSL is changed to the H level. Accordingly, the n-channel MOS transistors 103 and 104 are activated, the global data line GDL and the bit line BL are connected and the global data line /GDL and the bit line /BL are connected. At the same time as the column selection signal CSL is changed to the H level, the global data line precharge signal GPR is changed to the L level. Then, the data is transferred from the bit line pair BL and /BL to the global data line pair GDL and /GDL. As a result, as shown in FIG. 5, the potential of the global data line /GDL is changed to the voltage GND, while the potential of the global data line GDL is increased only to VDD−$V_t$, which is a voltage lower than the voltage VDD by the threshold voltage $V_t$ of the n-channel MOS transistor 103.

Then, the input signal MASW to the main amplifier switch is changed to the H level to activate the n-channel MOS transistors 107e and 107f of the read amplifier circuit 107. Accordingly, the signals of the global data line pair GDL and GDL are input to part of the read amplifier circuit 107 in charge of the amplification. Then, the main amplifier seizing signals MSE and /MSE are changed to the H and L levels, respectively. The read amplifier circuit 107 becomes active to amplify the signals of the global data line pair GDL and GDL corresponding to the data of the memory cell 101 and outputs the output data DO.

After the output data DO is delivered, the read amplifier circuit 107 is deactivated to get ready for the subsequent reading by returning the input signal MASW to the main amplifier switch to the L level and changing the main amplifier seizing signals MSE and /MSE to the L and H levels, respectively. Further, the column selection signal CSL is changed to the L level, at which the data of the bit lines BL and /BL is not transferred to the global data line pair GDL and /GDL. Thereafter, the global data line precharge signal GPR is turned to the H level. As a result, the n-channel MOS transistors 105a to 105c of the precharge circuit 105 are activated and the potentials of the global data lines GDL and /GDL are controlled by the precharge potential control circuit 106 to be equal to each other within the predetermined range.

Next, the writing of the semiconductor memory according to the first embodiment of the present invention is described with reference to a timing chart shown in FIG. 6.

Figure 6:
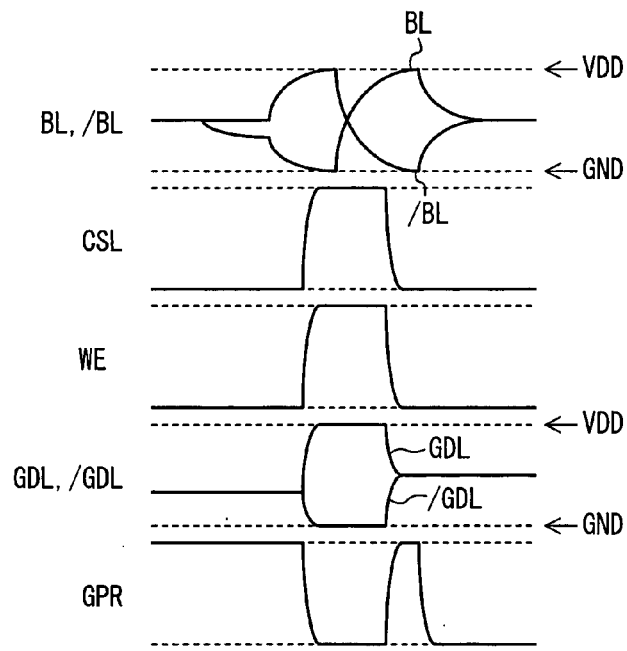
FIG. 6 is a timing chart illustrating voltage levels of signals during the writing operation of the semiconductor memory according to the first embodiment.

The timing chart of FIG. 6 shows voltage levels of signals during the writing operation of the semiconductor memory according to the first embodiment of the present invention.

When the word line WL connected to a certain memory cell 101 is activated, data stored in the memory cell 101 is output to the bit line BL or /BL. Then, the voltage between the bit lines BL and /BL is amplified by the sense amplifier circuit 102 in the active state. As a result, the potentials of the bit lines BL and /BL after the amplification become the voltages VDD and GND, respectively, as shown in FIG. 6.

When the sense amplifier circuit 102 initiates the amplification of the voltage between the bit lines BL and /BL, the global data line precharge signal GPR is at the H level. Therefore, the global data lines GDL and /GDL are precharged by the precharge circuit 105. That is to say, the n-channel MOS transistors 105*a* to 105*c* of the precharge circuit 105 are activated and the potentials of the global data lines GDL and /GDL are controlled by the precharge potential control circuit 106 to be equal to each other within the predetermined range as described later in detail.

The sense amplifier circuit 102 amplifies the potentials of the bit lines BL and /BL to the voltages VDD and GND, respectively, and the column selection signal CSL is changed to the H level. Accordingly, the n-channel MOS transistors 103 and 104 are activated, the global data line GDL and the bit line BL are connected and the global data line /GDL and the bit line /BL are connected. At the same time as the column selection signal CSL is changed to the H level, the global data line precharge signal GPR is changed to the L level and the write enable signal WE is changed to the H level to activate the write buffers 108 and 109. As a result, the potentials of the global data lines GDL and /GDL become those dependent on the input data DI. For example, as shown in FIG. 6, the potentials of the global data lines GDL and /GDL will be the voltages VDD and GND, respectively, and the potentials of the bit lines BL and /BL will be the voltages VDD-$V_t$ and GND, respectively. The data in the memory cell 101 is then rewritten to the data corresponding to the input data DI.

When the data is written, the write buffers 108 and 109 are deactivated to get ready for the subsequent reading by returning the write enable signal WE to the L level. Further, the column selection signal CSL is returned to the L level such that the data of the bit line pair BL and /BL is not transferred to the global data line pair GDL and /GDL. Then, the global data line precharge signal GPR is changed to the H level. As a result, the n-channel MOS transistors 105*a* to 105*c* of the precharge circuit 105 are activated and the potentials of the global data lines GDL and /GDL are controlled by the precharge potential control circuit 106 to be equal to each other within the predetermined range.

Next, explanation of how the thus-configured precharge potential control circuit 106 controls the potential of the global data lines GDL and /GDL during the precharge period is provided below.

Figure 7:
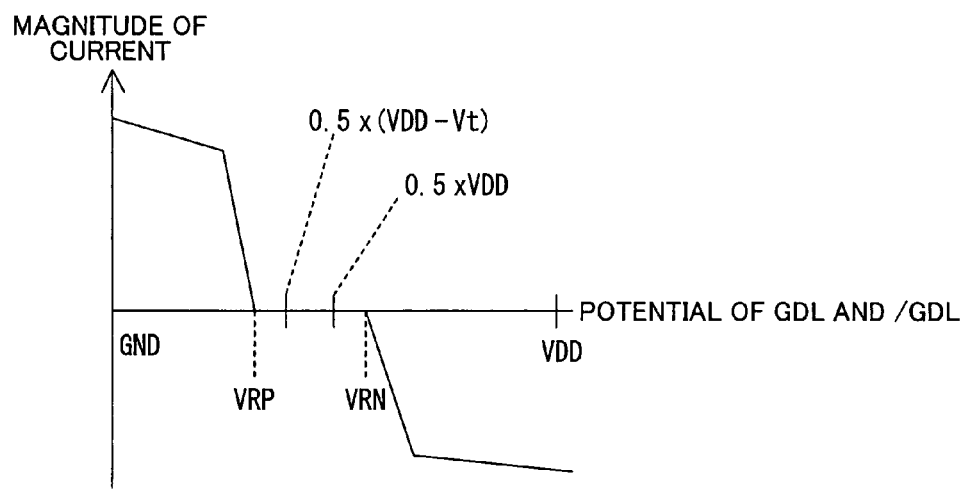
FIG. 7 is a graph illustrating the relationship between the magnitude of current flowing from the precharge potential control circuit 106 to a precharge circuit 105 and the potential of the global data lines GDL and /GDL in the semiconductor memory according to the first embodiment.

FIG. 7 is a graph illustrating the relationship between the magnitude of current flowing from the precharge potential control circuit 106 to the precharge circuit 105 and the potential of the global data lines GDL and /GDL in the thus-configured semiconductor memory.

When the potential of the global data lines GDL and /GDL is not higher than the first predetermined potential VRN and not lower than the second predetermined potential VRP, both of the p-channel MOS transistor 106*i* and the n-channel MOS transistor 106*j* are deactivated. Therefore, the precharge potential control circuit 106 does not apply voltage to the global data lines GDL and /GDL and the current does not flow thereto. Even if the potential of the global data lines GDL and /GDL is equal to the average potential of 0.5×(VDD−$V_t$) during reading or the average potential of 0.5×VDD during writing, the current will not flow during the precharge period. That is to say, the current will not flow during the precharge periods after the reading and the writing and the power is not consumed.

If the potential of the global data lines GDL and /GDL is not lower than the voltage GND and lower than the second predetermined potential VRP during the reading or writing period, the p-channel MOS transistor 106*i* is activated to let the current flow from the precharge potential control circuit 106 to the precharge circuit 105, thereby raising the potential of the global data lines GDL and /GDL. In contrast, when the potential of the global data lines GDL and /GDL is higher than the first predetermined potential VRN and not higher than the voltage VDD, the n-channel MOS transistor 106*j* is activated to let the current flow from the precharge circuit 105 to the precharge potential control circuit 106, thereby reducing the potential of the global data lines GDL and /GDL. In this manner, the potential of the global data lines GDL and /GDL is maintained within the range not higher than the first predetermined potential VRN and not lower than the second predetermined potential VRP, i.e., a potential near 0.5×VDD. As the potential of the global data lines GDL and /GDL is kept to a precharge potential near to 0.5×VDD, the read amplifier circuit 107 is operated appropriately. Further, even if there is leakage potential due to defects and variations in the manufacturing process of the global data lines GDL and /GDL, the potential of the global data lines GDL and /GDL is maintained not higher than the first predetermined potential VRN and not lower than the second predetermined potential VRP, i.e., near 0.5×VDD, as long as the current supply capacity allows. Thus, the read amplifier circuit 107 is operated appropriately.

In the above description, the first predetermined potential VRN is a voltage higher than 0.5×VDD by a certain amount of voltage and the second predetermined potential VRP is a voltage lower than 0.5×(VDD−$V_t$) by a certain amount of voltage. However, the present invention is not limited thereto. The predetermined potential may be varied as required depending on the appropriate operable range of the read amplifier circuit 107, allowable power consumption and a factor that varies the potential of the global data lines GDL and /GDL.

Second Embodiment

Figure 8:
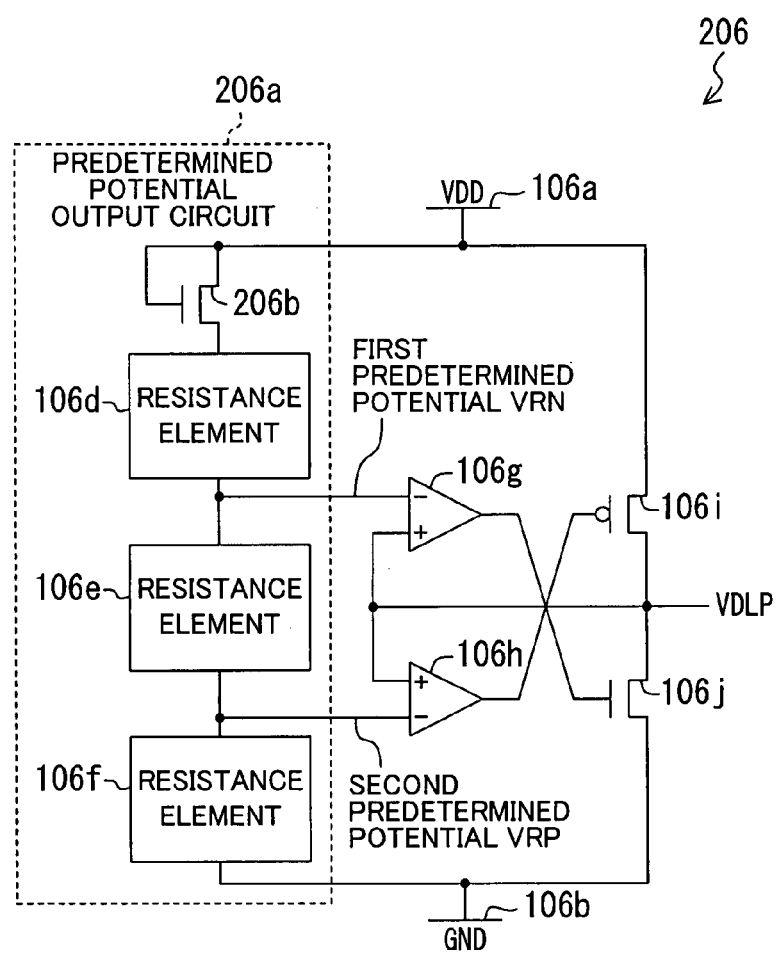
FIG. 8 is a circuit diagram illustrating the structure of a precharge potential control circuit 206 according to a second embodiment of the present invention.

A semiconductor memory according to a second embodiment of the present invention includes a precharge potential control circuit 206 as shown in FIG. 8 in place of the precharge potential control circuit 106 of the first embodiment.

The precharge potential control circuit 206 of the present embodiment is different from the precharge potential control circuit 106 in that a predetermined potential output circuit 206*a* corresponding to the predetermined potential output circuit 106 further includes an n-channel MOS transistor 206*b* connected to the high apply voltage generator.

The n-channel MOS transistor 206*b* is connected to the high apply voltage generator 106*a* via a drain and a gate thereof and to the resistance element 106*b* via a source thereof. The n-channel MOS transistor 206*b* may be an n-channel MOS transistor of the same size as the n-channel MOS transistor 103 and/or 104.

The constituents of the semiconductor memory of the present embodiment are operated in the same manner as those of the first embodiment except the predetermined potential output circuit 206a. The predetermined potential output circuit 206a divides the voltage between the source of the n-channel MOS transistor 206b connected to the high-apply voltage generator and the low apply voltage generator 106b to output the first and second predetermined potentials VRN and VRP.

With this configuration, the potential of the global data lines GDL and /GDL during the precharge will be a potential dependent on the supply voltage VDD which is the average potential of the global data lines GDL and /GDL before the precharge, i.e., 0.5×VDD for writing or 0.5×(VDD−$V_t$) for reading. Accordingly, in addition to the effect of the first embodiment, unwanted current does not flow even if the level of the supply voltage VDD is varied. Therefore, as compared with the first embodiment, the current consumption is reduced while the suitable range of the supply voltage VDD is kept broader. Further, as the area of a transistor is generally smaller than that of the resistance element 106d, the total area can also be reduced by using the transistor.

Third Embodiment

Figure 9:
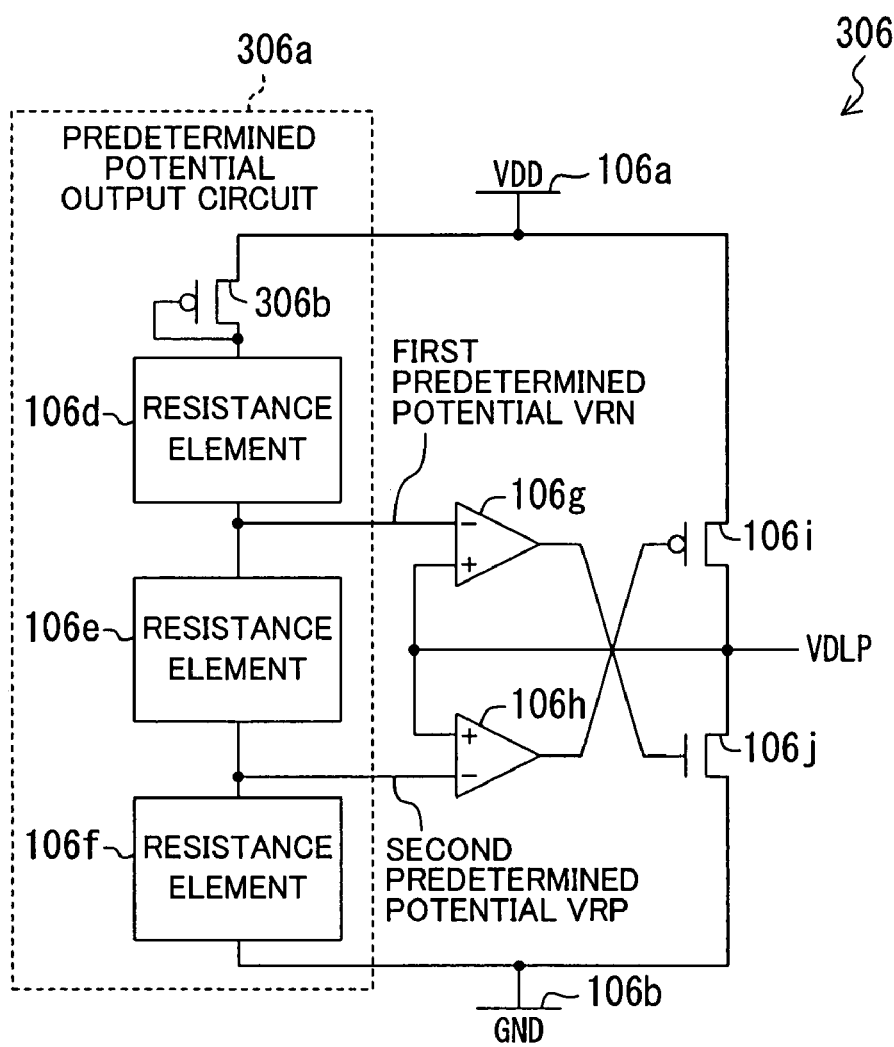
FIG. 9 is a circuit diagram illustrating the structure of a precharge potential control circuit 306 according to a third embodiment of the present invention.

A semiconductor memory according to a third embodiment of the present invention includes a precharge potential control circuit 306 as shown in FIG. 9 in place of the precharge potential control circuit 106 of the first embodiment.

The precharge potential control circuit 306 of the present embodiment is different from the precharge potential control circuit 106 in that a predetermined potential output circuit 306a corresponding to the predetermined potential output circuit 106c further includes a p-channel MOS transistor 306b connected to the high apply voltage generator.

The p-channel MOS transistor 306b is connected to the high apply voltage generator 106a via a source thereof and to the resistance element 106d via a drain and a gate thereof.

The constituents of the semiconductor memory of the present embodiment are operated in the same manner as those of the first embodiment except the predetermined potential output circuit 306a. The predetermined potential output circuit 306a divides the voltage between the drain and the gate of the p-channel MOS transistor 306b connected to the high apply voltage generator and the low apply voltage generator 106b to output the first and second predetermined potentials VRN and VRP.

With this configuration, a gate oxide film is less likely to be broken as compared with the second embodiment where the gate of the n-channel MOS transistor 206b is directly connected to the high apply voltage generator 106a. Further, the dependency of the potentials of the drain and the gate of the p-channel MOS transistor 306b on the supply voltage from the high apply voltage generator 106a is similar to the dependency of the average potential of the global data lines GDL and /GDL during reading on the supply voltage from the high apply voltage generator 106a. Therefore, as compared with the first embodiment, the power consumption is reduced while the suitable range of the supply voltage is kept broader.

Fourth Embodiment

Figure 10:
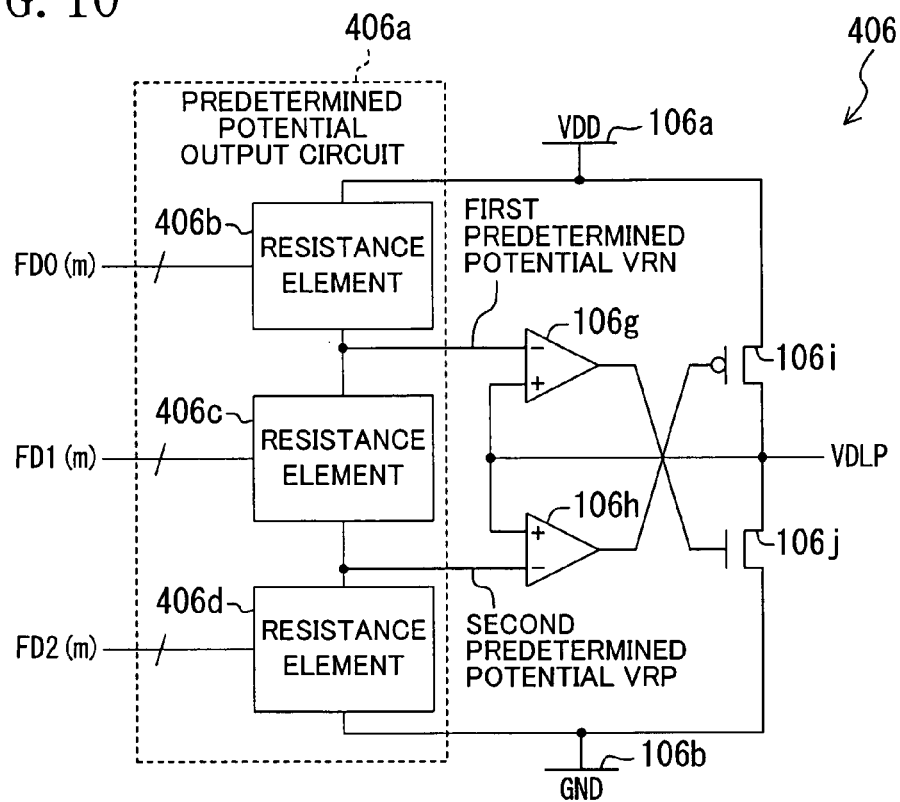
FIG. 10 is a circuit diagram illustrating the structure of a precharge potential control circuit 406 according to a fourth embodiment of the present invention.

A semiconductor memory of a fourth embodiment includes a precharge potential control circuit 406 as shown in FIG. 10 in place of the precharge potential control circuit 106 of the first embodiment.

The precharge potential control circuit 406 of the present embodiment is different from the precharge potential control circuit 106 in that a predetermined potential output circuit 406a includes resistance elements 406b to 406d capable of adjusting the resistance value in place of the resistance elements 106d to 106f of the predetermined potential output circuit 106c. The resistance value may be adjusted by laser trimming or with use of an anti-fuse after a circuit pattern is formed on the wafer.

Figure 11:
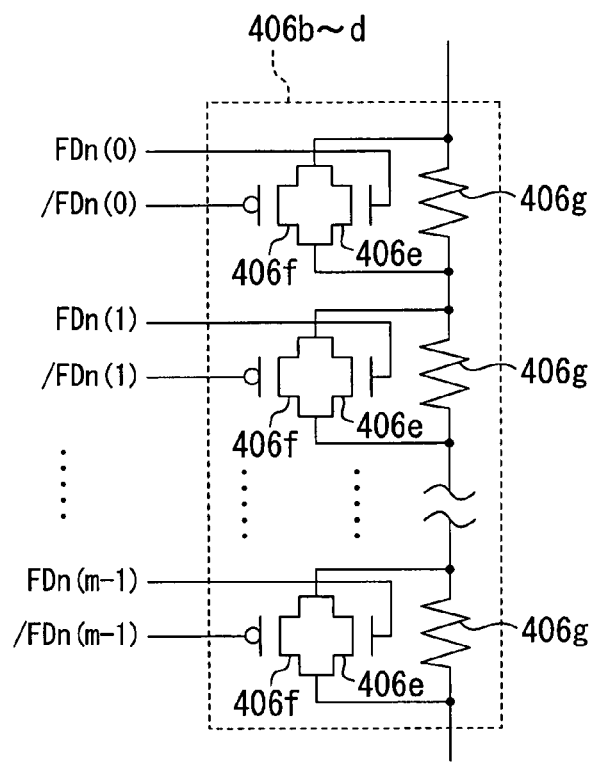
FIG. 11 is a circuit diagram illustrating the structure of resistance elements 406b to 406d whose resistance values are adjustable by laser trimming or using an anti-fuse.

FIG. 11 is a circuit diagram illustrating the resistance elements 406b to 406d whose resistance values are adjusted by laser trimming or with use of an anti-fuse.

As shown in FIG. 11, each of the resistance elements 406b to 406d includes circuits made of an n-channel MOS transistor 406e, a p-channel MOS transistor 406f and a resistance element 406g.

The gate of the n-channel MOS transistor 406e and the gate of the p-channel MOS transistor 406f are configured to receive fuse data $FD_n(k)$ and $\overline{FD_n}(k)$, respectively. In this diagram, n indicates to which one of the resistance elements 406b to 406d the fuse data is directed and m indicates the number of the resistance elements 406g contained in each of the resistance elements 406b to 406d. Further, k in the brackets indicates to which one of the plurality of resistance elements 406g the data is directed. The potentials of the fuse data $FD_n(k)$ and $\overline{FD_n}(k)$ are set by laser trimming or with use of the anti-fuse after the circuit pattern is formed on the wafer.

If the precharge potential control circuit 406 is used, the potentials of the fuse data $FD_n(k)$ and $\overline{FD_n}(k)$ are adjusted by laser trimming or with use of the anti-fuse. Therefore, after the circuit pattern is formed on the wafer, the resistance values of the resistance elements 406b to 406d are adjusted such that the predetermined potential output circuit 406a outputs a suitable first predetermined potential VRN and a suitable second predetermined potential VRP. Thus, the read amplifier circuit 107 is operated appropriately.

Fifth Embodiment

Figure 12:
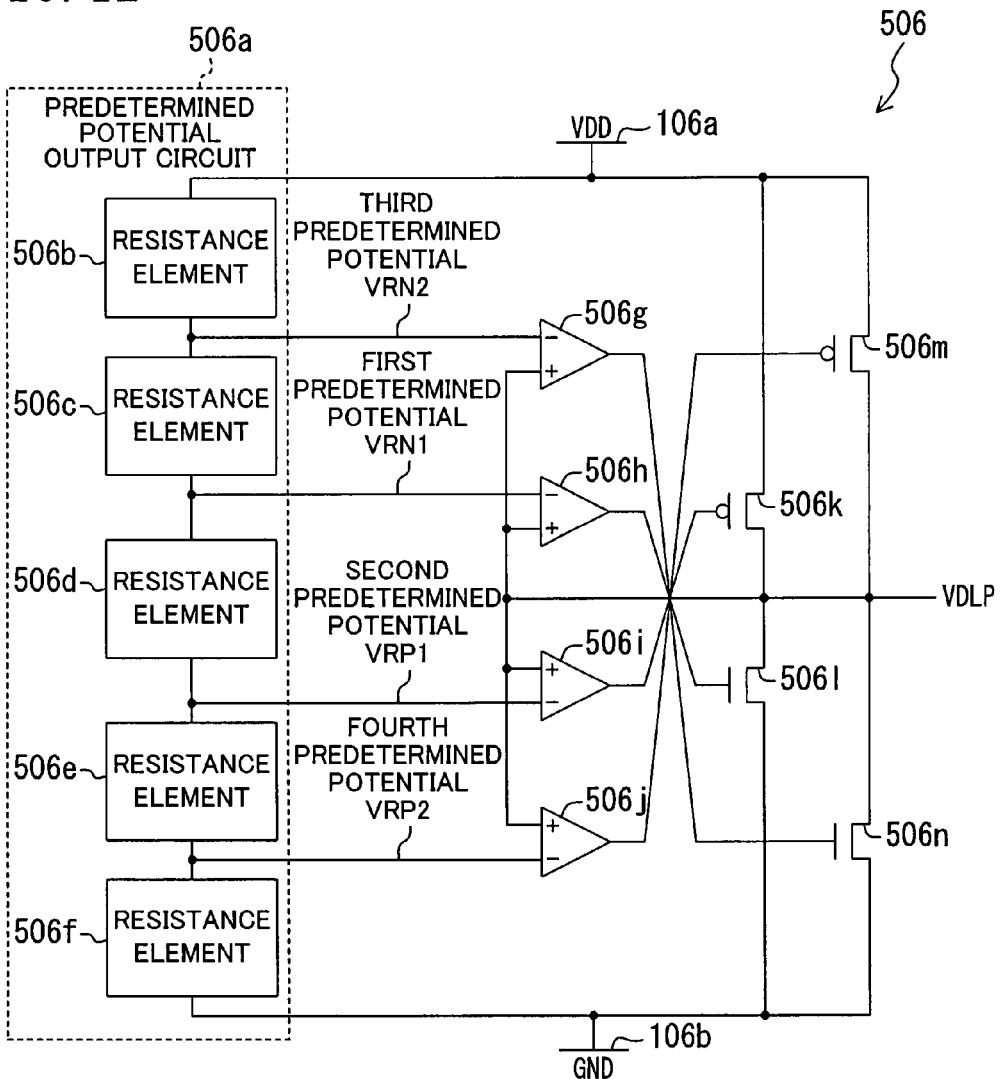
FIG. 12 is a circuit diagram illustrating the structure of a precharge potential control circuit 506 according to a fifth embodiment of the present invention.

A semiconductor memory of a fifth embodiment of the present invention includes a precharge potential control circuit 506 as shown in FIG. 12 in place of the precharge potential control circuit 106 of the first embodiment.

The precharge potential control circuit 506 of the present embodiment includes a high apply voltage generator 106a, a low apply voltage generator 106b, a predetermined potential output circuit 506a, differential amplifier circuits 506g to 506j, p-channel MOS transistors 506k and 506m and n-channel MOS transistors 506l and 506n.

The predetermined potential output circuit 506a includes resistance elements 506b to 506f and divides the voltage between the high apply voltage generator 106a and the low apply voltage generator 106b to output a first predetermined potential VRN1, a second predetermined potential VRP1, a third predetermined potential VRN2 and a fourth predetermined potential VRP2. For example, the predetermined potential output circuit 506a outputs a voltage lower than 0.5×VDD by a certain amount as VRN1, a voltage higher than 0.5×(VDD−$V_t$) by a certain amount as VRP1, a voltage higher than VRN1 by a certain amount as VRN2 and a voltage lower than VRP1 by a certain amount as VRP2.

When the potential of the global data lines GDL and /GDL is higher than the third predetermined potential VRN2, the differential amplifier circuit 506g outputs a high voltage to the gate of the n-channel MOS transistor 506n to activate the n-channel MOS transistor 506n. On the other hand, when the potential of the global data lines GDL and /GDL is not higher than the third predetermined potential VRN2, the differential amplifier circuit 506g outputs a low voltage to the gate of the n-channel MOS transistor 506n to deactivate the n-channel MOS transistor 506n.

When the potential of the global data lines GDL and /GDL is higher than the first predetermined potential VRN1, the differential amplifier circuit 506h outputs a high voltage to the gate of the n-channel MOS transistor 506l to activate the n-channel MOS transistor 506l. On the other hand, when the potential of the global data lines GDL and /GDL is not higher than the first predetermined potential VRN1, the differential amplifier circuit 506h outputs a low voltage to the gate of the n-channel MOS transistor 506l to deactivate the n-channel MOS transistor 506l.

When the potential of the global data lines GDL and /GDL is not lower than the second predetermined potential VRP1, the differential amplifier circuit 506i outputs a high voltage to the gate of the p-channel MOS transistor 506k to deactivate the n-channel MOS transistor 506k. On the other hand, when the potential of the global data lines GDL and /GDL is lower than the second predetermined potential VRP1, the differential amplifier circuit 506i outputs a low voltage to the gate of the p-channel MOS transistor 506k to activate the n-channel MOS transistor 506k.

When the potential of the global data lines GDL and /GDL is not lower than the fourth predetermined potential VRP2, the differential amplifier circuit 506j outputs a high voltage to the gate of the p-channel MOS transistor 506m to deactivate the p-channel MOS transistor 506m. On the other hand, when the potential of the global data lines GDL and /GDL is lower than the fourth predetermined potential VRP2, the differential amplifier circuit 506j outputs a low voltage to the gate of the p-channel MOS transistor 506m to activate the p-channel MOS transistor 506m.

The size of the p-channel MOS transistor 506m is larger than that of the p-channel MOS transistor 506k. Further, the size of the n-channel MOS transistor 506n is larger than that of the n-channel MOS transistor 506l.

The constituents of the semiconductor memory of the present embodiment are operated in the same manner as those of the semiconductor memory of the first embodiment except the precharge potential control circuit 506.

Figure 13:
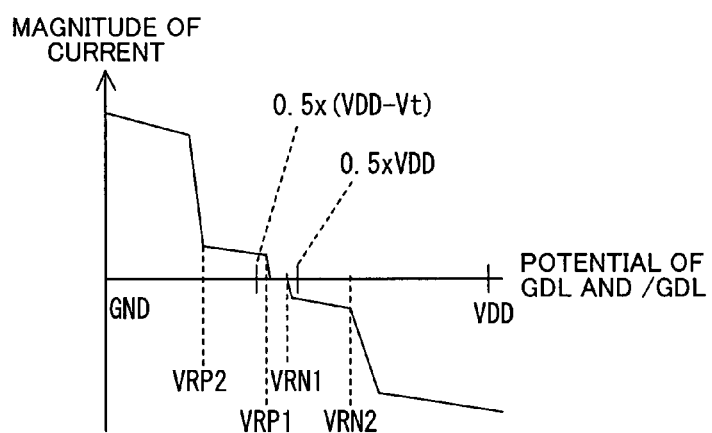
FIG. 13 is a graph illustrating the relationship between the magnitude of current flowing from the precharge potential control circuit 506 to a precharge circuit 105 and the potential of the global data lines GDL and /GDL in the semiconductor memory of the fifth embodiment.

Referring to FIG. 13, explanation of how the thus-configured precharge potential control circuit 506 controls the potential of the global data lines GDL and /GDL during the precharge period is provided below.

FIG. 13 is a graph illustrating the relationship between the magnitude of the current flowing from the precharge potential control circuit 506 to the precharge circuit 105 and the potential of the global data lines GDL and /GDL in the thus-configured semiconductor memory of the present embodiment.

When the potential of the global data lines GDL and /GDL is higher than the third predetermined potential VRN2, both of the n-channel MOS transistors 506l and 506n are activated. Therefore, the current flows from the precharge circuit 105 to the precharge potential control circuit 506 and the potential of the global data lines GDL and /GDL is reduced.

When the potential of the global data lines GDL and /GDL is not higher than the third predetermined potential VRN2 and higher than the first predetermined potential VRN1, only the n-channel MOS transistor 506l is activated. Therefore, the current flows from the precharge circuit 105 to the precharge potential control circuit 506 and the potential of the global data lines GDL and /GDL is reduced. Since only the n-channel MOS transistor 506l is activated at this time, the amount of the current flow is reduced as compared with the case where both of the n-channel MOS transistors 506l and 506n are activated. Therefore, power consumption per unit time is reduced.

When the potential of the global data lines GDL and /GDL is lower than the fourth predetermined potential VRP2, both of the p-channel MOS transistors 506k and 506m are activated. Therefore, the current flows from the precharge potential control circuit 506 to the precharge circuit 105 and the potential of the global data lines GDL and /GDL is increased.

When the potential of the global data lines GDL and /GDL is not lower than the fourth predetermined potential VRP2 and lower than the second predetermined potential VRP1, only the p-channel MOS transistor 506k is activated. Therefore, the current flows from the precharge potential control circuit 506 to the precharge circuit 105 and the potential of the global data lines GDL and /GDL is increased. Since only the p-channel MOS transistor 506k is activated, the amount of the current flow is reduced as compared with the case where both of the p-channel MOS transistors 506k and 506m are activated. Therefore, power consumption per unit time is reduced.

When the potential of the global data lines GDL and /GDL is not higher than the first predetermined potential VRN1 and not lower than the second predetermined potential VRP1, the p-channel MOS transistors 506k and 506m and the n-channel MOS transistors 506l and 506n are all deactivated. Therefore, no voltage is applied to the global data lines GDL and /GDL from the precharge potential control circuit 506 and the current does not flow.

According to the above-described operation, the potential of the global data lines GDL and /GDL is maintained not higher than the first predetermined potential VRN1 and not lower than the second predetermined potential VRP1 after a lapse of sufficient time from the start of the precharge. In this way, as the potential of the global data lines GDL and /GDL is maintained not higher than the first predetermined potential VRN1 and not lower than the second predetermined potential VRP1, i.e., near 0.5×VDD, the read amplifier circuit 107 is operated appropriately. Further, even if there is leakage potential due to defects and variations in the manufacturing process of the global data lines GDL and /GDL, the potential of the global data lines GDL and /GDL is maintained not higher than the first predetermined potential VRN1 and not lower than the second predetermined potential VRP1, i.e., near 0.5×VDD, as long as the current supply capacity allows. Thus, the read amplifier circuit 107 is operated appropriately.

When the potential of the global data lines GDL and /GDL after reading is $0.5 \times (VDD-V_t)$, which is the average potential of the global data lines GDL and /GDL during reading, the current flows until the potential of the global data lines GDL and /GDL reaches the second predetermined potential VRP1. Once the potential of the global data lines GDL and /GDL reaches the second predetermined potential VRP1, the current does not flow anymore. On the other hand, when the potential of the global data lines GDL and /GDL after writing is 0.5×VDD, which is the average potential of the global data lines GDL and /GDL during writing, the current flows until the potential of the global data lines GDL and /GDL reaches the first predetermined potential VRN1. Once the potential of the global data lines GDL and /GDL reaches the first predetermined potential VRN1, the current does not flow anymore. That is, as the potential of the global data lines GDL and /GDL falls within a predetermined range, the voltage supply is stopped and the current does not flow anymore. Therefore, as compared with the conventional case where the current flows until the potential reaches one predetermined value, the average amount of current flowing during the precharge periods is reduced and the power consumption is also reduced.

When the potential of the global data lines GDL and /GDL is higher than the third predetermined potential VRN2, the current becomes larger than a current flowing when the potential of the global data lines GDL and /GDL is not higher than the third predetermined potential VRN2 and higher than the first predetermined potential VRN1. As a result, the potential of the global data lines GDL and /GDL drops faster. Likewise, when the potential of the global data lines GDL and /GDL is lower than the fourth predetermined potential VRP2, the current becomes larger than a current flowing when the potential of the global data lines GDL and /GDL is not lower than the fourth predetermined potential VRP2 and lower than the second predetermined potential VRP1. Therefore, the potential of the global data lines GDL and /GDL is increased faster.

Operation stability and power consumption of the read amplifier circuit 107 can be adjusted by varying the precharge period. For example, if the precharge period is prolonged such that the potential of the global data lines GDL and /GDL surely falls within the range not higher than the first predetermined potential VRN1 and not lower than the second predetermined potential VRP1, the read amplifier circuit 107 is operated with higher stability. Conversely, if the read amplifier circuit 107 is operated sufficiently as long as the potential of the global data lines GDL and /GDL is maintained within the range not higher than the third predetermined potential VRN2 and not lower than the fourth predetermined potential VRP2, the power consumption is reduced by merely reducing the precharge period to some extent. To be more specific, if the precharge period is shorter than the period required to shift the potential of the global data lines GDL and /GDL to that not higher than the first predetermined potential VRN1 and not lower than the second predetermined potential VRP1, a period over which the current flows is reduced, though the potential of the global data lines GDL and /GDL does not always fall within the range not higher than the first predetermined potential VRN1 and not lower than the second predetermined potential VRP1. As a result, the power consumption is reduced.

As described above, the semiconductor memory of the present invention has the effect of reducing the current consumed during the precharge period. For example, the semiconductor memory of the present invention is useful for a dynamic random access memory (DRAM).

What is claimed is:

1. A semiconductor memory including a memory cell, a bit line pair connected to the memory cell, a data line pair connected to the bit line pair through a switching element capable of ON/OFF switching in response to a value of a column selection signal and a precharge circuit for controlling an initial potential common between the data line pair, wherein
the semiconductor memory comprises a precharge potential control circuit which applies, in a precharge period,
a low apply voltage not higher than a first predetermined potential to the data line pair when the initial potential of the data line pair is higher than the first predetermined potential,
a high apply voltage not lower than a second predetermined potential to the data line pair when the potential of the data line pair is lower than the second predetermined potential or
no voltage when the potential of the data line pair is not higher than the first predetermined potential and not lower than the second predetermined potential,
wherein the precharge potential control circuit includes a predetermined potential output circuit which divides a voltage between a low apply voltage generator for generating the low apply voltage and a high apply voltage generator for generating the high apply voltage to output the first and second predetermined potentials,
the predetermined potential output circuit includes an n-channel MOS transistor connected to the high apply voltage generator via a drain and a gate thereof, and
the predetermined potential output circuit divides a voltage between a source of the n-channel MOS transistor connected to the high apply voltage generator and the low apply voltage generator to output the first and second predetermined potentials.

2. The semiconductor memory of claim 1, wherein the switching element is an n-channel MOS transistor of the same size as the n-channel MOS transistor connected to the high apply voltage generator.

3. A semiconductor memory including a memory cell, a bit line pair connected to the memory cell, a data line pair connected to the bit line pair through a switching element capable of ON/OFF switching in response to a value of a column selection signal and a precharge circuit for controlling an initial potential common between the data line pair, wherein
the semiconductor memory comprises a precharge potential control circuit which applies, in a precharge period,
a low apply voltage not higher than a first predetermined potential to the data line pair when the initial potential of the data line pair is higher than the first predetermined potential,
a high apply voltage not lower than a second predetermined potential to the data line pair when the potential of the data line pair is lower than the second predetermined potential or
no voltage when the potential of the data line pair is not higher than the first predetermined potential and not lower than the second predetermined potential,
wherein the precharge potential control circuit includes a predetermined potential output circuit which divides a voltage between a low apply voltage generator for generating the low apply voltage and a high apply voltage generator for generating the high apply voltage to output the first and second predetermined potentials,
the predetermined potential output circuit includes a p-channel MOS transistor which is connected to the high apply voltage generator via a source thereof and has a drain and a gate connected to each other, and
the predetermined potential output circuit divides a voltage between the drain and the gate of the p-channel MOS transistor connected to the high apply voltage generator and the low apply voltage generator to output the first and second predetermined potentials.

4. A semiconductor memory including a memory cell, a bit line pair connected to the memory cell, a data line pair connected to the bit line pair through a switching element capable of ON/OFF switching in response to a value of a column selection signal and a precharge circuit for controlling an initial potential common between the data line pair, wherein
the semiconductor memory comprises a precharge potential control circuit which applies, in a precharge period,
a low apply voltage not higher than a first predetermined potential to the data line pair when the initial potential of the data line pair is higher than the first predetermined potential,
a high apply voltage not lower than a second predetermined potential to the data line pair when the potential of the data line pair is lower than the second predetermined potential or no voltage when the potential of the data line pair is not higher than the first predetermined potential and not lower than the second predetermined potential, wherein the precharge potential control circuit includes a predetermined potential output circuit which divides a voltage between a low apply voltage generator for generating the low apply voltage and a high apply voltage generator for generating the high apply voltage to output the first and second predetermined potentials, and the predetermined potential output circuit divides the voltage between the low apply voltage generator and the high apply voltage generator with resistance elements capable of adjusting their resistance values.

5. A semiconductor memory including a memory cell, a bit line pair connected to the memory cell, a data line pair connected to the bit line pair through a switching element capable of ON/OFF switching in response to a value of a column selection signal and a precharge circuit for controlling an initial potential common between the data line pair, wherein the semiconductor memory comprises a precharge potential control circuit which applies, in a precharge period, a low apply voltage not higher than a first predetermined potential to the data line pair when the initial potential of the data line pair is higher than the first predetermined potential, a high apply voltage not lower than a second predetermined potential to the data line pair when the potential of the data line pair is lower than the second predetermined potential or no voltage when the potential of the data line pair is not higher than the first predetermined potential and not lower than the second predetermined potential, wherein the precharge potential control circuit includes:

an n-channel MOS transistor connected to the low apply voltage generator via a source thereof and connected to the data line pair via a drain thereof, a p-channel MOS transistor connected to the high apply voltage generator via a source thereof and connected to the data live pair via a drain thereof, an n-channel MOS transistor control circuit which outputs a voltage to a gate of the n-channel MOS transistor to activate or deactivate the n-channel MOS transistor when the potential of the date line pair is higher or lower than the first predetermined potential, and a p-channel MOS transistor control circuit which outputs a voltage to a gate of the p-channel MOS transistor to activate or deactivate the p-channel MOS transistor when the potential of the data line pair is lower or higher than the second predetermined potential.

6. A semiconductor memory including a memory cell, a bit line pair connected to the memory cell, a data line pair connected to the bit line pair through a switching element capable of ON/OFF switching in response to a value of a column selection signal and a precharge circuit for controlling an initial potential common between the data line pair, wherein the semiconductor memory comprises a precharge potential control circuit which applies, in a precharge period, a low apply voltage not higher than a first predetermined potential to the data line pair when the initial potential of the data line pair is higher than the first predetermined potential, a high apply voltage not lower than a second predetermined potential to the data line pair when the potential of the data line pair is lower than the second predetermined potential or no voltage when the potential of the data line pair is not higher than the first predetermined potential and not lower than the second predetermined potential, wherein the precharge potential control circuit includes:

a first differential amplifier circuit which receives the potential of the date line pair and the first predetermined potential and outputs a voltage corresponding to the magnitude relation between the potential of the data line pair and the first predetermined potential and a second differential amplifier circuit which receives the potential of the data line pair and the second predetermined potential and outputs a voltage corresponding the magnitude relation between the potential of the data line pair and the second predetermined potential and the precharge potential control circuit determines whether or not the low apply voltage is applied to the data line pair in accordance with the output of the first differential amplifier circuit and determines whether or not the high apply voltage is applied to the data line pair in accordance with the output of the second differential amplifier circuit.

7. The semiconductor memory of claim 1 further comprising a sense amplifier circuit for amplifying a signal of the bit line pair, wherein a high drive voltage for the sense amplifier circuit is supplied from a voltage generator for generating the high apply voltage.

8. The semiconductor memory of claim 1 further comprising a sense amplifier for amplifying a signal of the bit line pair, wherein a low drive voltage for the sense amplifier circuit is supplied from a voltage generator for generating the low apply voltage.

9. The semiconductor memory of claim 1 further comprising a sense amplifier circuit for amplifying a signal of the bit line pair, wherein the switching element is an n-channel MOS transistor which is activated by the same voltage as the higher drive voltage for the sense amplifier circuit.

10. A semiconductor memory including a memory cell, a bit line pair connected to the memory cell, a data line pair connected to the bit line pair through a switching element capable of ON/OFF switching in response to a value of a column selection signal and a precharge circuit for controlling an initial potential common between the data line pair, wherein the semiconductor memory comprises a precharge potential control circuit which applies, in a precharge period, a low apply voltage not higher than a first predetermined potential to the data line pair when the initial potential of the data line pair is higher than the first predetermined potential, a high apply voltage not lower than a second predetermined potential to the data line pair when the potential of the data line pair is lower than the second predetermined potential or no voltage when the potential of the data line pair is not higher than the first predetermined potential and not lower than the second predetermined potential, said semiconductor memory further comprising a read amplifier circuit for amplifying a signal of the data line pair, wherein the read amplifier circuit includes:

a first n-channel MOS transistor connected to a low drive voltage generator for generating a low drive voltage for the read amplifier circuit via a source thereof, connected to a first data line of the data line pair via a drain thereof and connected to a second data line of the data line pair via a gate thereof during the amplification, a second n-channel MOS transistor connected to the low drive voltage generator via a source thereof, connected to the second data line via a drain thereof and connected to the first data line via a gate thereof during the amplification, a first p-channel MOS transistor connected to a high drive voltage generator for generating a high drive voltage for the read amplifier circuit via a source thereof, connected to the first data line via a drain thereof and connected to the second data line via a gate thereof during the amplification and a second p-channel MOS transistor connected to the high drive voltage generator via a source thereof, connected to the second data line via a drain thereof and connected to the first data line via a gate thereof during the amplification.

11. The semiconductor memory of claim 1, wherein the precharge circuit enables current to flow from the precharge circuit to the data line pair when the potential of the data line pair is higher than a third predetermined potential which is higher than the first predetermined potential, the current being larger than current flowing when the potential of the data line pair is not higher than the third predetermined potential.

12. The semiconductor memory of claim 1, wherein the precharge circuit enables current to flow from the precharge circuit to the data line pair when the potential of the data line pair is lower than a fourth predetermined potential which is lower than the second predetermined potential, the current being larger than current flowing when the potential of the data line pair is not lower than the fourth predetermined potential.

13. The semiconductor memory of claim 1, wherein the precharge circuit enables current to flow from the precharge circuit to the data line pair when the potential of the data line pair is higher than a third predetermined potential which is higher than the first predetermined potential, the current being larger than current flowing when the potential of the data line pair is not higher than the third predetermined potential and the precharge circuit enables current to flow from the precharge circuit to the data line pair when the potential of the data line pair is lower than a fourth predetermined potential which is lower than the second predetermined potential, the current being larger than current flowing when the potential of the data line pair is not lower than the fourth predetermined potential.

14. The semiconductor memory of claim 13, wherein the precharge potential control circuit includes a predetermined potential output circuit which divides a voltage between a low apply voltage generator for generating the low apply voltage and a high apply voltage generator for generating the high apply voltage to output the first, second, third and fourth predetermined potentials.

15. The semiconductor memory of claim 13, wherein the precharge potential control circuit includes a first n-channel MOS transistor and a second n-channel MOS transistor each of which is connected to the low apply voltage generator via a source thereof and connected to the data line pair via a drain thereof, a first p-channel MOS transistor and a second p-channel MOS transistor each of which is connected to the high apply voltage generator via a source thereof and connected to the data line pair via a drain thereof, a first n-channel MOS transistor control circuit which outputs a voltage to a gate of the first n-channel MOS transistor to activate or deactivate the first n-channel MOS transistor when the potential of the data line pair is higher or lower than the third predetermined potential, a second n-channel MOS transistor control circuit which outputs a voltage to a gate of the second n-channel MOS transistor to activate or deactivate the second n-channel MOS transistor when the potential of the data line pair is higher or lower than the first predetermined potential, a first p-channel MOS transistor control circuit which outputs a voltage to a gate of the first p-channel MOS transistor to activate or deactivate the first p-channel MOS transistor when the potential of the data line pair is lower or higher than the second predetermined potential and a second p-channel MOS transistor control circuit which outputs a voltage to a gate of the second p-channel MOS transistor to activate or deactivate the second p-channel MOS transistor when the potential of the data line pair is lower or higher than the fourth predetermined potential.

16. The semiconductor memory of claim 15, wherein the size of the first n-channel MOS transistor is larger than that of the second n-channel MOS transistor and the size of the second p-channel MOS transistor is larger than the first p-channel MOS transistor.

17. The semiconductor memory of claim 13, wherein the precharge potential control circuit includes a first differential amplifier circuit which receives the potential of the data line pair and the third predetermined potential and outputs a voltage corresponding to the magnitude relation between the potential of the data line pair and the third predetermined potential, a second differential amplifier circuit which receives the potential of the data line pair and the first predetermined potential and outputs a voltage corresponding to the magnitude relation between the potential of the data line and the first predetermined potential, a third differential amplifier circuit which receives the potential of the data line pair and the second predetermined potential and outputs a voltage corresponding to the magnitude relation between the potential of the data line and the second predetermined potential, a fourth differential amplifier circuit which receives the potential of the data line pair and the fourth predetermined potential and outputs a voltage corresponding to the magnitude relation between the potential of the data line and the fourth predetermined potential, the precharge potential control circuit determines whether or not the low apply voltage is applied to the data line pair in accordance with the output of the second differential amplifier circuit and whether or not the high apply voltage is applied to the data line pair in accordance with the output of the third differential amplifier circuit and the precharge potential control circuit changes current flowing to the precharge circuit in accordance with the outputs of the first and fourth differential amplifier circuits.

* * * * *